United States Patent
Müller et al.

(10) Patent No.: US 8,155,238 B2
(45) Date of Patent: Apr. 10, 2012

(54) DEVICE FOR PROCESSING RADIO TRANSMISSION DATA WITH DIGITAL PREDISTORTION

(75) Inventors: Jan-Erik Müller, Ottobrunn (DE); Nazim Ceylan, München (DE)

(73) Assignee: Intel Mobile Communications GmbH, Neubiberg (DE)

( * ) Notice: Subject to any disclaimer, the term of this patent is extended or adjusted under 35 U.S.C. 154(b) by 762 days.

(21) Appl. No.: 11/112,057

(22) Filed: Apr. 22, 2005

(65) Prior Publication Data

US 2005/0249309 A1 Nov. 10, 2005

(30) Foreign Application Priority Data

Apr. 23, 2004 (DE) .................. 10 2004 019 984

(51) Int. Cl.
*H04K 1/02* (2006.01)
(52) U.S. Cl. ......... 375/297; 375/301; 375/310; 375/315
(58) Field of Classification Search .................. 375/296, 375/297, 308, 260, 305, 274; 341/143, 120; 330/10, 136; 455/114.3, 115.1, 114.1
See application file for complete search history.

(56) References Cited

U.S. PATENT DOCUMENTS

| 6,246,286 B1 | 6/2001 | Persson ........................ 330/149 |
| 6,853,246 B2 * | 2/2005 | Bauder et al. ................. 330/149 |
| 6,873,218 B2 * | 3/2005 | Khlat ............................ 332/103 |
| 7,026,871 B2 * | 4/2006 | Saed ............................. 330/149 |
| 2003/0035494 A1 | 2/2003 | Bauder et al. ................. 375/296 |
| 2005/0009479 A1 * | 1/2005 | Braithwaite ............... 455/114.3 |

FOREIGN PATENT DOCUMENTS

| EP | 1 318 643 | 6/2003 |
| SE | EP 1318643 | * 6/2003 |

OTHER PUBLICATIONS

Matsuya, Y.; Uchimura, K.; Iwata, A.; Kaneko, T.; "A 17 bit oversampling D-A conversion technology using multistage noise shaping", Solid-State Circuits, IEEE Journal of, vol. 24, Issue 4, Aug. 1989 pp. 969-975.*

* cited by examiner

*Primary Examiner* — Khanh C Tran
*Assistant Examiner* — Qutbuddin Ghulamali

(57) ABSTRACT

A device for processing data which is to be transmitted by radio, with the data to be transmitted being in the form of a digital baseband signal (DAT1), has a filter unit (301) for pulse shaping and oversampling of the digital baseband signal (DAT1), a predistortion unit (302, 303) for predistortion of the filtered and oversampled digital baseband signal (DAT2), and a control unit (304, 313) for controlling the predistortion unit (302, 303) as a function of the digital baseband signal (DAT1).

17 Claims, 6 Drawing Sheets

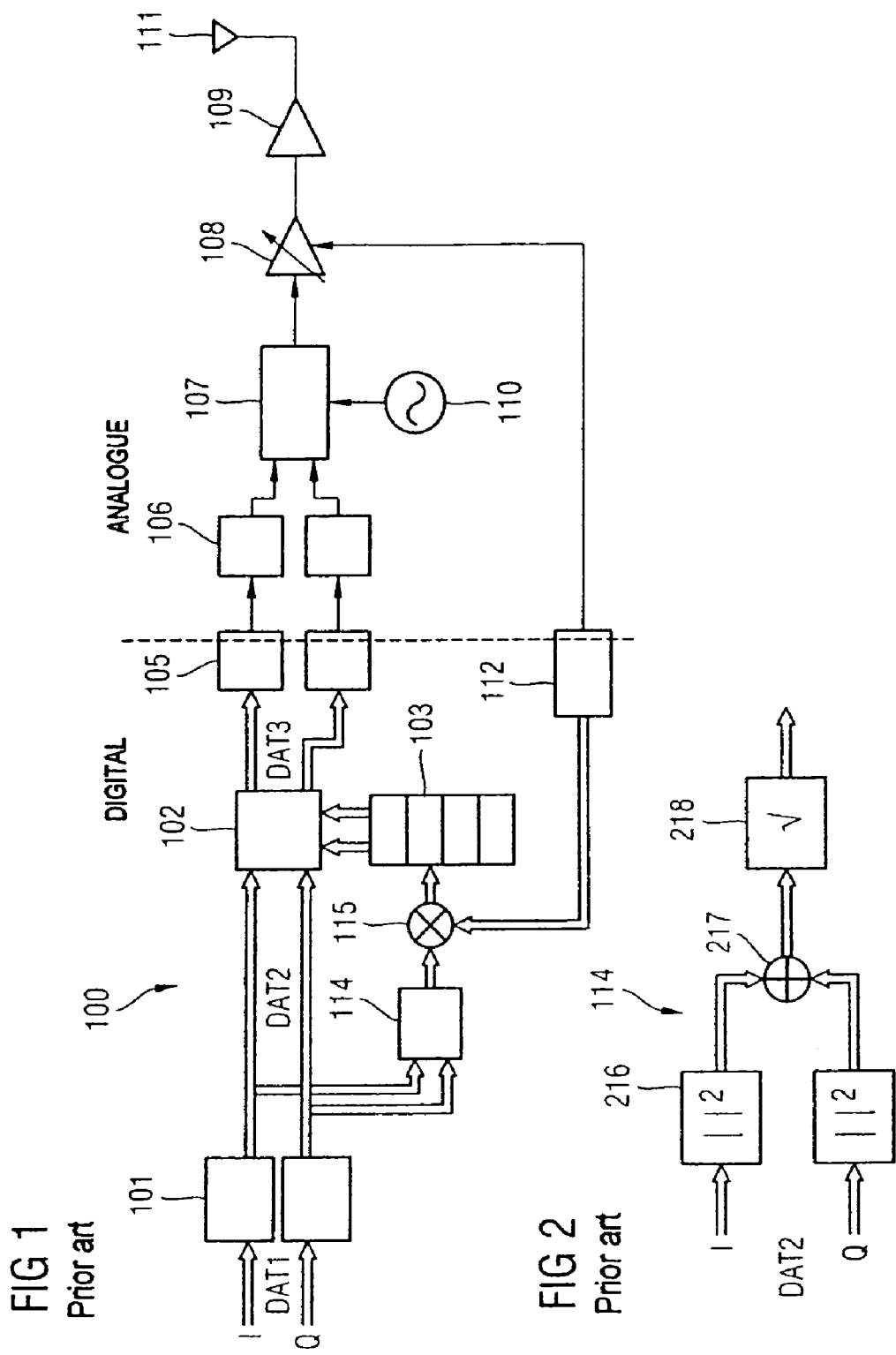

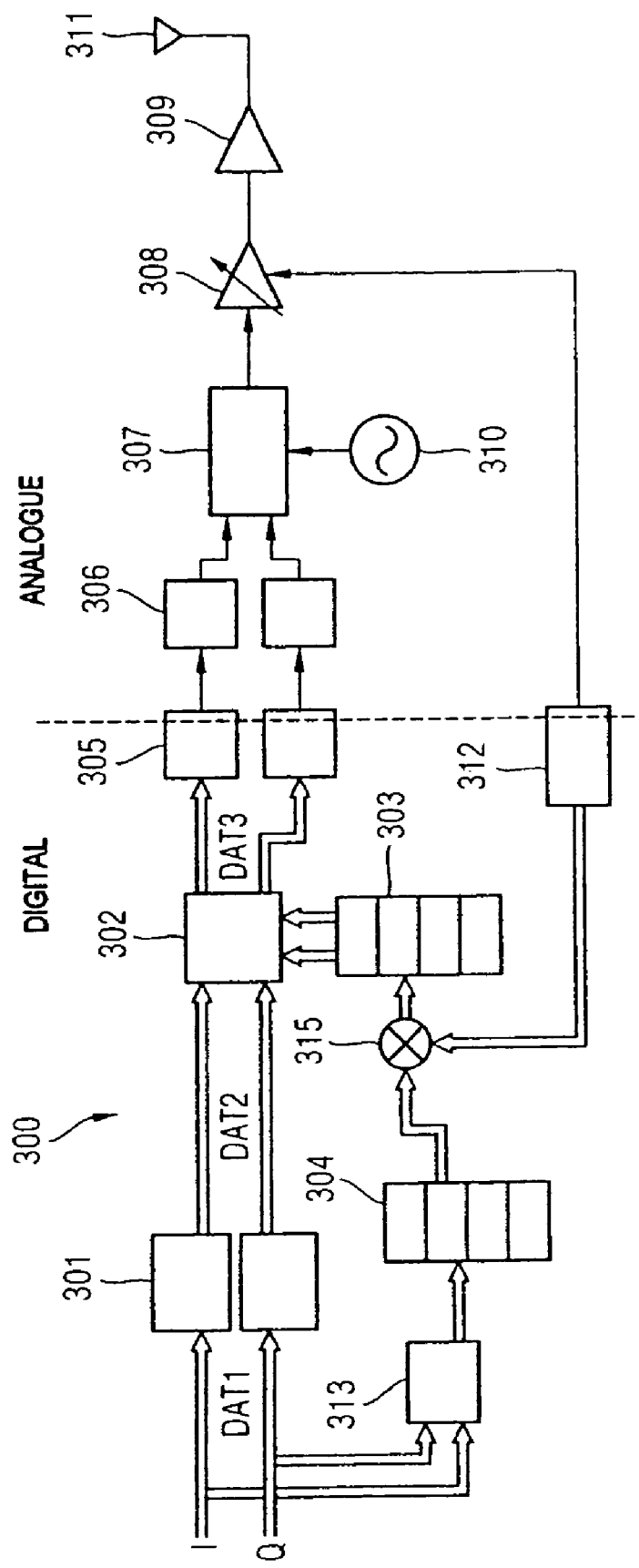

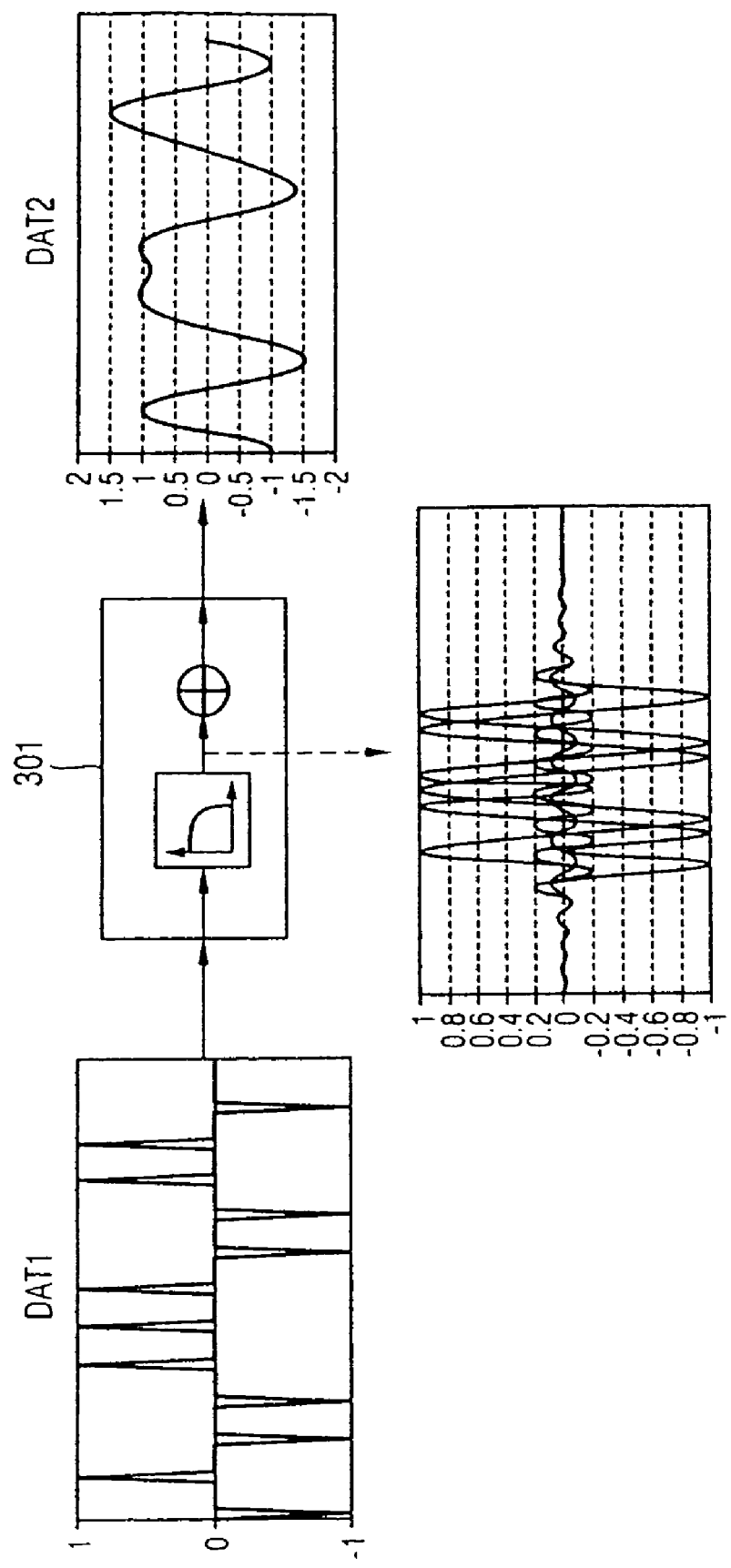

— ▫ — ACPR I w.o. pred
— ▫ — ACPR II w.o. pred
— △ — ACPR I Magnitude addr
— △ — ACPR II Magnitude addr
— ○ — ACPR I Symbol addr
— ○ — ACPR II Symbol addr ----- roll off factor 0.12
——— roll off factor 0.22
·········· roll off factor 0.32

DEVICE FOR PROCESSING RADIO
TRANSMISSION DATA WITH DIGITAL
PREDISTORTION

PRIORITY

This application claims priority from German Patent Application No. 102004019984.1, which was filed on Apr. 23, 2004, and is incorporated herein by reference in its entirety.

TECHNICAL FIELD OF THE INVENTION

The present invention generally relates to a device and a method by means of which data to be transmitted by radio can be processed. In particular, the device and the method are designed to carry out predistortion of a baseband signal which is generated from the data to be transmitted. The invention furthermore relates to a transmitting device for transmission of data by radio, with the transmitting device having the device which has been mentioned. A corresponding transmission method is likewise covered by the subject matter of the invention.

DESCRIPTION OF RELATED ART AND BACKGROUND OF THE INVENTION

The trend for modem mobile radios is to use multifunctional mobile communication appliances which have multimedia capabilities and, in addition to multiband operation (0.9/1.8-2/2.5 GHz), are also designed for multistandard operation (GSM/PCN/UMTS/WLAN). This requires the use of bandwidth-efficient linear modulation forms such as 8PSK (phase shift keying), QPSK (quadrature phase shift keying) or QAM (quadrature amplitude modulation). This results in particularly stringent linearity requirements for the transmission path in order to keep transmission errors in the case of output signals at high levels as small as possible. A power amplifier must therefore be arranged at the output of the transmission signal path, with linearity which is as good as possible over a wide range. Since power amplifiers in mobile radios represent a high proportion of the total power consumption, the power amplifier which has been mentioned should also consume little power.

High power amplifier efficiency, that is to say a high ratio of the RF power that is produced to the power that is required, is generally achieved in the maximum power area in which the RF transmission characteristic of the power amplifier has severe non-linearities, however. Good linearity of the power amplifier can be achieved only with low efficiency, that is to say with a low output power in comparison to the DC power required by the power amplifier. In the case of mobile radios that are known at the moment, it is impossible without considerable additional complexity to achieve good linearity and a low current consumption, that is to say a long battery operating life, at the same time.

In order to solve this problem, it has been proposed that the baseband signals be subjected to predistortion before being fed to the power amplifier. The baseband signals are in this case predistorted in such a way as to compensate for the non-linear output characteristic of the power amplifier, by means of the predistortion. The non-linearities in the transmission path are thus compensated for in a suitable form. This allows a high output power with the power amplifier consuming little power at the same time, without the non-linearities that result from this unacceptedly modifying the output signal.

Since the non-linearities in the transmission path depend on the amplitude of the baseband signal, but not on its phase, the amplitude of the baseband signal must be taken into account when determining the predistortion coefficients. The amplitude-dependent predistortion coefficients may, for example, be stored in a memory. An address calculation must be carried out on the basis of the baseband signal in order to select the correct predistortion coefficient from the memory.

Conventional methods for address calculation are magnitude addressing and square magnitude addressing. Magnitude addressing generally requires more complexity than square magnitude addressing, but magnitude addressing has the advantage of a uniform amplitude increase.

Furthermore, in the case of conventional transmitting devices, the predistortion for the components I and Q in the baseband signal must be carried out in real time, thus resulting in stringent requirements for the rate at which the computation operations are carried out. The computation power required in this case depends on the bandwidth of the signal, on the clock frequency, on the oversampling factor and on the number and complexity of the computation operations which are required in the predistorter. The required chip area and the power consumption of the predistorter increase with the computation complexity.

Transmitting devices with adaptive predistortion stages are described in the German Patent Applications with the file references 103 45 517.5 and 103 45 553.1. These applications are hereby included in the disclosure content of the present patent application.

SUMMARY OF THE INVENTION

One object of the invention is to provide a device for processing data to be transmitted by radio, which carries out digital predistortion of the baseband signal and in which the complexity associated with the predistortion process is as low as possible. A further aim is to provide a transmitting device for transmission of data by radio, which includes this device. Corresponding methods are likewise intended to be specified.

The objective on which the invention is based can be achieved by a device for processing data which is to be transmitted by radio, with the data to be transmitted being in the form of a digital baseband signal, comprising a filter unit for pulse shaping and oversampling of the digital baseband signal, a predistortion unit for predistortion of the filtered and oversampled digital baseband signal, and a control unit for controlling the predistortion unit as a function of the digital baseband signal.

The predistortion unit may have a multiplication unit for multiplication of the filtered and oversampled digital baseband signal by predistortion coefficients. The predistortion unit may have a first memory for storage of the predistortion coefficients, and the control unit can be designed such that it selects predistortion coefficients from the first memory as a function of the digital baseband signal. The control unit may have a second memory, in which magnitudes which correspond to the filtered and oversampled digital baseband signal are stored, and in which case the predistortion coefficients can be selected on the basis of these magnitudes. The control unit may have addressing logic which is designed such that it selects the approximate magnitudes of the filtered and oversampled digital baseband signal from the second memory on the basis of the digital baseband signal. The digital baseband signal and the baseband signals which are produced from it can be complex signals. The device may comprise a digital/analogue converter unit for digital/analogue conversion of the predistorted baseband signal. The device may comprise a further filter unit for low-pass filtering of the analogue baseband signal. The device may comprise a modulator unit with an oscillator for modulation of a radio-frequency carrier, with the baseband signal, in particular via an intermediate frequency. The device may comprise an amplifier unit for amplification of the modulated radio-frequency signal with, in particular, a variable gain, with the gain being controllable in analogue form or being digitally programmable. The device may comprise a power amplifier for amplification of the modulated radio-frequency signal. The device may comprise a power control unit for controlling the addressing of the first memory and/or for controlling the gain of the amplifier unit, with the power control unit being designed in such a way that it controls the addressing of the first memory as a function of the digital baseband signal and as a function of the signal which is desired by the power amplifier, and that it controls the gain of the amplifier unit as a function of the signal which is desired by the power amplifier. A transmitting device for sending data by radio, with the data to be transmitted being in the form of a digital baseband signal, may comprise such a device for processing of the digital baseband signal.

The object can furthermore be achieved by a method for processing of data to be transmitted by radio, with the data to be transmitted being in the form of a digital baseband signal, comprising the following method steps (a) filtering and oversampling the digital baseband signal; and (b) predistorting the filtered and oversampled digital baseband signal, wherein the predistortion of the filtered and oversampled digital baseband signal is controlled as a function of the digital baseband signal.

For predistortion, the filtered and oversampled digital baseband signal can be multiplied by predistortion coefficients. The predistortion coefficients can be stored in advance in a first memory, and the predistortion coefficients can be selected from the first memory for predistortion as a function of the digital baseband signal. Magnitudes which correspond to the filtered and oversampled digital baseband signal can be stored in advance in a second memory, and the predistortion coefficients can be selected on the basis of these magnitudes. The approximate magnitudes of the filtered and oversampled digital baseband signal can be selected from the second memory on the basis of the digital baseband signal. The digital baseband signal and the baseband signals which can be produced from it are complex signals. The predistorted digital baseband signal can be converted to an analogue baseband signal. A radio-frequency carrier can be modulated with the baseband signal, in particular via an intermediate frequency. The modulated radio-frequency signal can be amplified with, in particular, a variable gain, with the gain being controllable in analogue form or being digitally programmable. The modulated radio-frequency signal can be amplified by a power amplifier. The addressing of the first memory can be controlled as a function of the digital baseband signal and as a function of the signal which is desired by the power amplifier, and/or the gain of the modulated radio-frequency signal can be controlled as a function of the signal which is desired by the power amplifier. A method for transmission of data by radio, with the data to be transmitted being in the form of a digital baseband signal, may use such a method for processing the digital baseband signal.

The device according to the invention is designed to process data which is intended to be transmitted by radio at a later time. In particular, this processing is intended to be designed for subsequent power amplification of the data to be processed. The data to be processed is in the form of a digital baseband signal in the device according to the invention.

In order to carry out the processing of the data, the device according to the invention has a filter unit, a predistortion unit and a control unit. The filter unit carries out pulse shaping and oversampling of the digital baseband signal. In this case, the digital baseband signal is used as it enters the device according to the invention. The predistortion unit carries out predistortion of the digital baseband signal that is emitted from the filter unit. The control unit controls the predistortion unit and in turn uses the digital baseband signal in the way that it is available to the device according to the invention.

One major idea of the invention is that the digital baseband signal is used to control the predistortion unit, before it is filtered and oversampled. In the case of conventional devices which have the same purpose as the device according to the invention, the filtered and oversampled baseband signal is, in contrast, used for controlling the predistortion unit.

Since the baseband signals which are used according to the invention for controlling the predistortion unit flow at a lower rate than the filtered and oversampled baseband signals, the device according to the invention has the advantage that the speed requirements for the control unit are considerably less than normal. If in contrast, a baseband signal which has been oversampled by an oversampling of 8 were to be used, this would result in the signal processing speed of the control unit being eight times greater. This advantageous characteristic of the control unit results in considerably less circuit complexity in the design of the device according to the invention in comparison to conventional devices which are used for the same purpose.

Furthermore, the power consumption of the device according to the invention is also comparatively less.

The predistortion unit preferably has a multiplication unit, which multiplies the digital baseband signal, that has been filtered and oversampled by means of the filter unit, by predistortion coefficients. This is a simple and low-complexity measure for carrying out the predistortion process.

According to one advantageous refinement of the device according to the invention, the predistortion unit has a first memory in which predistortion coefficients are stored before the predistortion process is carried out. Furthermore, this refinement of the device according to the invention provides for the control unit to select predistortion coefficients from the first memory as a function of the digital baseband signal, and for the selected predistortion coefficients then to be supplied to the multiplication unit for multiplication by the filtered and oversampled baseband signal.

The advantage of the refinement of the device according to the invention as described above is that there is no need for a continuously processing calculation unit for calculation of the predistortion coefficients in real time. Rather than a calculation unit such as this with a high computation power requirement, the present refinement of the device according to the invention provides for the predistortion coefficients, which depend on the power amplifier, to be calculated externally in an open-loop arrangement, and to be read to the first memory once. In the case of a closed-loop or adaptive arrangement, the predistortion coefficients are calculated, and are read to the memory, occasionally. During operation of the device according to the invention, the digital baseband signals which enter the device according to the invention determine which predistortion coefficients are selected from the first memory.

The control unit preferably has a second memory, in which values are stored in advance which correspond approximately to the magnitudes, that is to say to the amplitudes, of the filtered and oversampled digital baseband signal. The predistortion coefficients which are stored in particular in the first memory are selected on the basis of the magnitudes stored in the second memory, during operation of the device according to the invention. This measure saves a complex address calculation unit, since, if the filter characteristic of the filter unit is known, the magnitudes of the filtered and oversampled digital baseband signal can be calculated externally in advance and need be read to the second memory only once.

In order to make it possible to select the magnitudes from the second memory using the digital baseband signal, addressing logic is preferably integrated in the device according to the invention. The addressing logic can be provided with considerably less complexity on the basis of the magnitudes, which are already stored in the second memory, of the filtered and oversampled digital baseband signal, than is required for the production of an address calculation unit which would have to calculate the addresses for the first memory without the assistance of the second memory.

The digital baseband signal and the baseband signals, which are produced from it, for the transmission signal path, such as the oversampled digital baseband signal, which has been filtered by the filter unit, or the predistorted digital baseband signal, or the analogue baseband signal which is mentioned further below, preferably exist in the form of complex signals. In this case, by way of example, these signals have an in-phase component and a quadrature component, which are normally referred to as I and Q components, or as I and Q signals. The fact that the baseband signals are in the form of complex, two-component signals means that at least some of the components which are arranged in the transmission signal path are duplicated. For example, in this case, the filter unit comprises two filters, each of which is designed for pulse shaping and oversampling of one component of the digital baseband signal.

A digital/analogue converter unit is preferably provided, and converts the predistorted baseband signal to an analogue baseband signal.

It is also advantageous to integrate a further filter unit in the transmission signal path, in order to smooth the analogue baseband signal, and to chop off the harmonics, by low-pass filtering.

A further advantageous refinement of the device according to the invention provides a modulator unit which uses an oscillator to modulate a radio-frequency signal with the baseband signal. Both direct conversion and conversion by means of an intermediate frequency may be provided. The modulator unit may be integrated in the digital part or in the analogue part of the transmission signal path.

One particularly preferred refinement of the device according to the invention is characterized by an amplifier unit for amplification of the modulated radio-frequency signal, in particular with a variable gain. In this case, the gain can either be controlled in an analogue form, or can be programmed digitally.

According to one further particularly preferred refinement of the device according to the invention, a power amplifier is connected in the analogue part of the transmission signal path. In particular, the power amplifier is connected downstream from the amplifier unit.

Power control can preferably be provided as is described in the German Patent Applications, which have already been mentioned above, with the file references 103 45 517.5 and 103 45 553.1. This may be an adaptive open-loop arrangement or an adaptive closed-loop arrangement. The power control unit is used to control the addressing of the first memory and/or to control the gain of the amplifier unit. The addressing of the first memory is controlled as a function of the digital baseband signal and as a function of the signal which is desired by the power amplifier. The gain of the amplifier unit is controlled as a function of the signal which is desired by the power amplifier.

The transmitting device according to the invention which, in particular, may be used in the mobile radio field is used for sending data by radio. In this case, the data which is intended to be transmitted subsequently is passed to the transmitting device according to the invention in the form of a digital baseband signal. The transmitting device according to the invention has a device for processing the digital baseband signal, and having the features described above.

Since the device according to the invention is implemented in the transmitting device according to the invention, the transmitting device according to the invention has the same advantages over conventional transmitting devices as the device according to the invention.

The method according to the invention is designed for processing data to be transmitted by radio. The data to be transmitted is in the form of a digital baseband signal. The method according to the invention has the following method steps:

(a) the digital baseband signal is filtered and oversampled; and (b) the filtered and oversampled digital baseband signal is predistorted, with the predistortion of the filtered and oversampled digital baseband signal being controlled as a function of the digital baseband signal.

The method according to the invention has the advantage that the baseband signals which are used to control the predistortion flow at a lower rate than the filtered and oversampled baseband signals, so that the speed requirements for the control process are considerably less stringent than normal.

BRIEF DESCRIPTION OF THE DRAWINGS

The invention will be explained in more detail in the following text using examples and with reference to the drawings, in which:

FIG. 1 shows a block diagram of a transmitting device with digital predistortion according to the prior art;

FIG. 2 shows a block diagram of an address calculation unit according to the prior art;

FIG. 3 shows a block diagram of a transmitting device with digital predistortion as an exemplary embodiment of the transmitting device according to the invention;

FIG. 4 shows a schematic illustration of filtering by means of the pulse shaping filter 301;

DETAILED DESCRIPTION OF PREFERRED EMBODIMENTS

Figure 5:
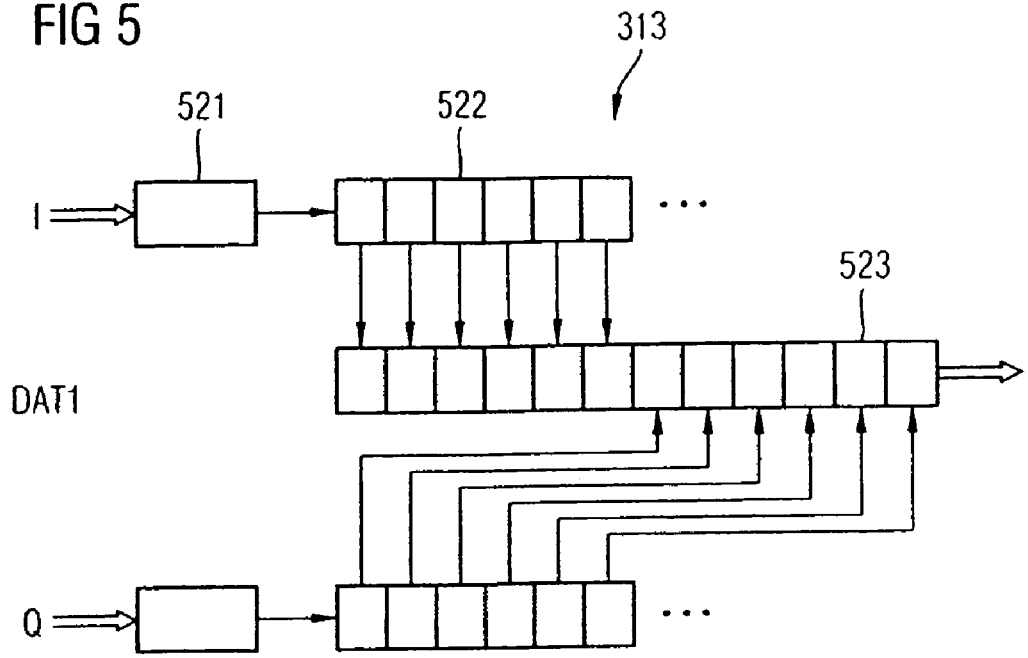
FIG. 5 shows a block diagram of the addressing logic 313.

FIG. 1 shows a block diagram of a conventional transmitting device 100 with digital predistortion.

The transmitting device 100 carries out pulse shaping and oversampling as well as subsequent digital predistortion of a digital baseband signal, converts the predistorted baseband signal to an analogue signal, amplifies this analogue signal, and transmits it via an antenna.

In FIG. 1, the subdivision of the transmitting device 100 into an analogue part and a digital part is indicated by a dashed line.

A processor unit, which is not shown in FIG. 1, uses the data to be transmitted to produce a complex, digital baseband signal DAT1 (which is formed from the two components I and Q) at its outputs. The components I and Q represent the in-phase and quadrature components of the complex baseband signal DAT1. The two outputs of the processor unit are connected to in each case one input of the digital pulse shaping filters 101.

The object of the pulse shaping filter 101 is to keep the bandwidth of the modulation signal, and the crosstalk to the adjacent channel, low. To do this, the pulse shaping filters 101 carry out the pulse shaping and oversampling of the baseband signal DAT1 component-by-component.

The components I and Q of the baseband signal DAT2, which is derived from the baseband signal DAT1, can be tapped off at the outputs of the pulse shaping filters 101. The two components I and Q of the filtered and oversampled baseband signal DAT2 feed both a complex multiplier 102 and an address calculation unit 114.

The complex multiplier 102 multiplies the components I and Q of the baseband signal DAT2 by predistortion coefficients which are stored in a memory 103. The address calculation unit 114 selects the suitable predistortion coefficients from the memory 103 using the baseband signal DAT2. To this purpose, the address calculation unit 114 is designed as illustrated schematically in FIG. 2.

In the address calculation unit 114, the components I and Q of the baseband signal DAT2 are first of all supplied to two magnitude squaring devices 216, are then added by means of an adder 217, and are passed to a square root calculation unit 218.

The address which is produced at the output of the address calculation unit 114 is multiplied by means of a multiplier 115 by a value which has been calculated by a power control unit 112. The address obtained in this way feeds a control input of the memory 103, and thus selects a complex predistortion coefficient, which is stored in the memory 103 and which is applied to the baseband signal DAT2.

The predistorted baseband signal DAT3 which is obtained by multiplication by the predistortion coefficient is produced at the output of the complex multiplier 102 as an I component and a Q component, and is passed to digital/analogue converters 105, which convert the predistorted baseband signal DAT3 to analogue signals component-by-component.

The analogue baseband signal feeds the low-pass filters 106, which smooth the analogue baseband signal and cut off harmonics.

The outputs of the low-pass filters 106 are connected to the inputs of a quadrature modulator 107, which converts the analogue baseband signal to the desired radio-frequency signal by means of a local oscillator 110.

The quadrature modulator 107 is followed by an amplifier 108 which can be controlled in an analogue form. The gain of the controllable amplifier 108 is set by the power control unit 112 via a control input of the controllable amplifier 108. Instead of the amplifier 108 which can be controlled in an analogue form, it is also possible to provide a digitally programmable amplifier.

A power amplifier 109 is connected downstream from the controllable amplifier 108 in the transmission signal path. The signals which are emitted from the controllable amplifier 108 are amplified with a fixed gain by the power amplifier 109, and are then passed to an antenna 111, which emits the signals.

A bandpass filter can also be provided in the transmission signal path, in order to reduce the noise from the transmitter in the reception band.

The power control unit 112 may be designed in accordance with the requirements described in the German Patent Applications with the file references 103 45 517.5 and 103 45 553.1. The power control process can accordingly be based on an adaptive open-loop arrangement or an adaptive closed-loop arrangement. The power control unit 112 controls the addressing of the memory 103, and sets the gain of the controllable amplifier 108. The control process is carried out as a function of the signal which is desired by the power amplifier 109.

FIG. 3 shows an exemplary embodiment of the device according to the invention in the form of a block diagram of a transmitting device 300, as may be implemented, by way of example, in a mobile radio.

The arrangement of the components in the transmission signal path of the transmitting device 300 shown in FIG. 3 corresponds to that of the transmitting device 100 shown in FIG. 1. The transmitting devices 100 and 300 differ in the circuit parts which are in each case responsible for the selection of the predistortion coefficients.

Since some of the components in the transmitting devices 100 and 300 are identical, these components are identified by two identical digits at the end of the respective reference symbols in FIGS. 1 and 3.

The way in which the predistortion coefficients are determined in the transmitting device 300 will be explained in the following text. The design and operation of the other circuit parts of the transmitting device 300 are the same as those in the above description of the transmitting device 100.

In the transmitting device 300, the components I and Q of the digital baseband signal DAT1 are output from the transmission signal path in order to use them for selection of the predistortion coefficients, before the digital baseband signal DAT1 is supplied to the pulse shaping filters 301.

The digital baseband signal DAT1 is composed of data bits which arrive in accordance with a chip rate, for example at 3.84 MHz in the WCDMA Standard. No symbol formation has yet been carried out here. Data symbols are not formed until in the pulse shaping filters 301. For this purpose, the data bits at the inputs of the pulse shaping filters 301 are converted to discrete values corresponding to the oversampling factor which, for example, is 8. At the outputs of the pulse shaping filters 301, a data symbol then contains a number of discrete values, with this number corresponding to the oversampling factor. The sample rate is in this case the same as the chip rate multiplied by the oversampling factor. By way of example, the sample rate for an oversampling factor of 8 in the WCDMA Standard is 3.84 MHz×8=30.72 MHz.

FIG. 4 shows the filter function of the pulse shaping filters 301. By way of example, the pulse shaping filters 301 are RRC (root raised cosine) filters. The bits of the baseband signal DAT1 which are illustrated by way of example in the left-hand diagram in FIG. 4 are entered in the pulse shaping filters 301. The impulse responses (which are produced by the low-pass filtering) of the bits are illustrated in the lower diagram. The added sum of the impulse responses of the bits which are fed into the pulse shaping filters 301 can be tapped off at the outputs of the pulse shaping filters 301. The digital baseband signal DAT2 which is produced at the outputs of the pulse shaping filters 301 is illustrated, by way of example, in the right-hand diagram in FIG. 4.

If the input data stream and the filter characteristic of the pulse shaping filters 301 are known, the output signal from the pulse shaping filters 301 can be calculated from them. This situation forms the basis for the present invention.

The magnitudes which correspond to the complex baseband signals DAT2 have accordingly been stored in a rewritable memory 304, for example once during production of the equipment. All the possible amplitudes of the filtered and oversampled complex baseband signal DAT2 are thus stored in the memory 304, with the amplitude values being in an approximate and discrete form. This information is required for addressing of the memory 303 in which the predistortion coefficients are stored.

The amplitude values of the baseband signal DAT2 are read from the memory 304 by means of the addressing logic 313, which is dependent on the baseband signal DAT1. FIG. 5 shows a block diagram of the addressing logic 313. On the input side, the addressing logic 313 has two conversion units 521. The conversion units 521 must be designed in such a way that they write to the shift registers 522 those bits which represent the digital values arriving at the address logic 313. The number of these bits for each digital value for the I path is annotated a, and the number for the Q path is annotated b. The parameters a and b can be calculated from the equations $n_I=2^a$ and $n_Q=2^b$. The lengths of the shift registers 522 depend on the number of symbols which are used for addressing the memory 304, and on the parameters a and b. The shift registers 522 are always full. New bits are shifted into the shift registers 522 in each clock cycle. Furthermore, the contents of the shift registers 522 are written to an address buffer 523 in each clock cycle.

The data items for the I and Q components, which are temporarily stored in the shift registers 522, are placed alongside one another in the address buffer 523. The resultant binary number in the address buffer 523 indicates the address which is required for reading a value from the memory 304. The amplitudes of the complex baseband signal DAT2, which occur at the outputs of the pulse shaping filters 301, are stored in an approximate form in the memory 304 at the address determined by the addressing logic 313.

Consequently, the address calculation unit 114 in the transmitting device 100 and the memory 304 in the transmitting device 300 emit approximately the same addresses, which are then required for selection of the predistortion coefficients from the memories 103 and 303, respectively. Since, however, the baseband signal DAT1 which is used for address generation for the transmitting device 300 is not oversampled, in contrast to the baseband signal DAT2, the addressing logic 313 can be clocked considerably more slowly than the address calculation unit 114.

The magnitude values to be stored in the memory 304 are generally different for the different modulation standards that are used in multimode appliances. This situation can be taken into account by providing a dedicated memory area in the memory 304, as well as separate addressing logic 313, for each modulation standard. The respective addressing logic 313 is then selected on the basis of the operating requirements.

Parameters for the design of the memory 304 are stated in the following text, and the accuracy with which the predistortion process can be carried out will be explained with reference to two examples.

The required size M for the memory 304 and the accuracy of the predistortion depend on the number of successive symbols which are used for addressing the memory 304, as well as on the oversampling factor and the number of points in the constellation diagram. The required size M of the memory 304 is accordingly calculated as follows:

$$M=r*(n_I^x/2)*(n_Q^x/2) \quad (1)$$

In equation (1), r denotes the oversampling factor, x the number of symbols which are used for addressing, $n_I$ the number of different discrete values which I can assume in the constellation diagram, and $n_Q$ denotes the number of different discrete values which Q can assume for each of the values I in the constellation diagram.

While equation (1) is always valid, special cases can occur in which $n_I=n_Q$. Examples of cases such as these are QPSK, 16QAM and 64QAM. In these cases, the size M of the memory 304 as calculated on the basis of equation (1) is reduced, and the following equation is applicable:

$$M=r/2*(n_I^x/2)*[(n_Q^x/2)+1] \quad (2)$$

In order to implement the equation (2), the addressing logic 313 shown in FIG. 5 must be modified by in each case inserting an additional block between the shift registers 522 and the address buffers 523. These blocks suitably influence the bit sequences which are transmitted to the address buffer 523, and thus ensure correct address calculation for the memory 304.

A first example is based on a QPSK signal with four states in the constellation diagram ($n_I=2, n_Q=2, a=1, b=1$). Owing to the values of the parameters a and b in this case, the conversion units 521 in this example may be formed by signum functions. The RRC pulse shaping filters 301 that are used have a roll-off factor of 0.22 and a length of 16. The oversampling factor r is 8. x=6 successive symbols in the I and Q paths are used for addressing the memory 304. This results in a memory requirement M of 8 kwords (or 4 kwords on the basis of equation (2)).

For the present example, simulations and measurements show correspondingly good accuracies for the predistortion with a small memory requirement.

The content of the memory 304 need be calculated and stored only once. In this case, the memory content may be calculated outside the mobile radio. Furthermore, no recalculation is required. The memory 304 can be addressed very quickly since it is activated only once during one symbol and only one position in the memory 304 need be read, without any computation operation.

In contrast, in the case of conventional magnitude addressing, as is illustrated in FIGS. 1 and 2, the address for each sample must be calculated (eight times during one symbol). The calculation in each case requires two squaring operations, one addition and the formation of one square root for each I and Q pair. This involves a comparatively large amount of computation complexity and a comparatively high power consumption.

Figure 6:
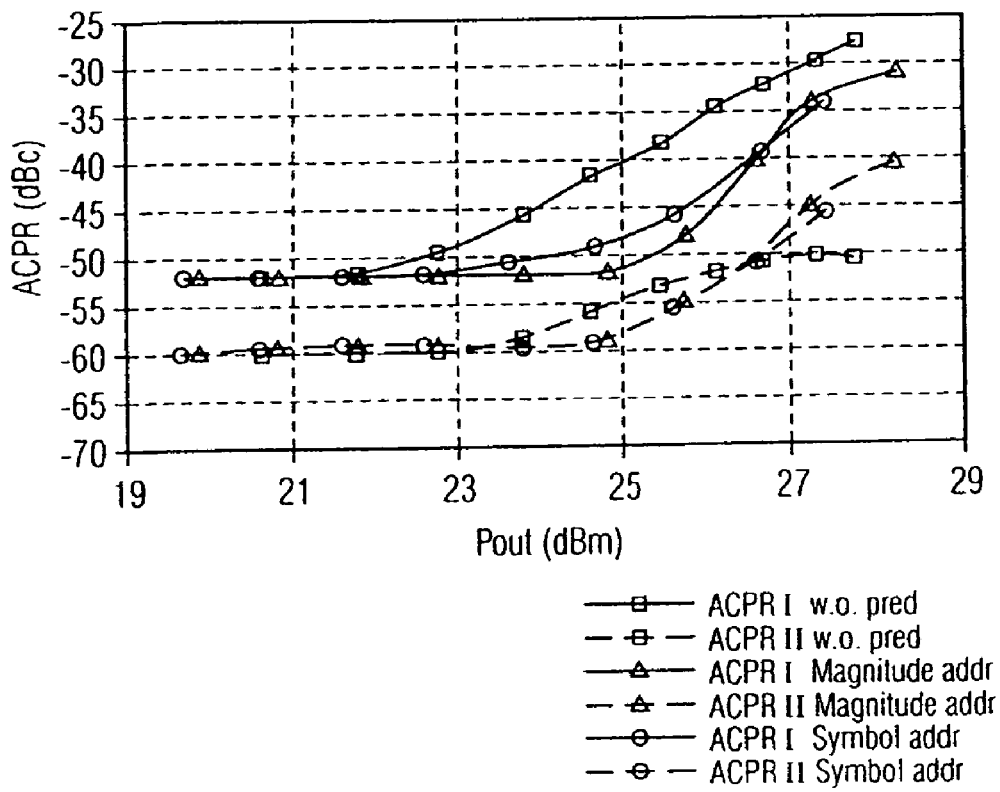
FIG. 6 shows an illustration of ACPR measurement results for a QPSK-modulated signal.
Figure 7:
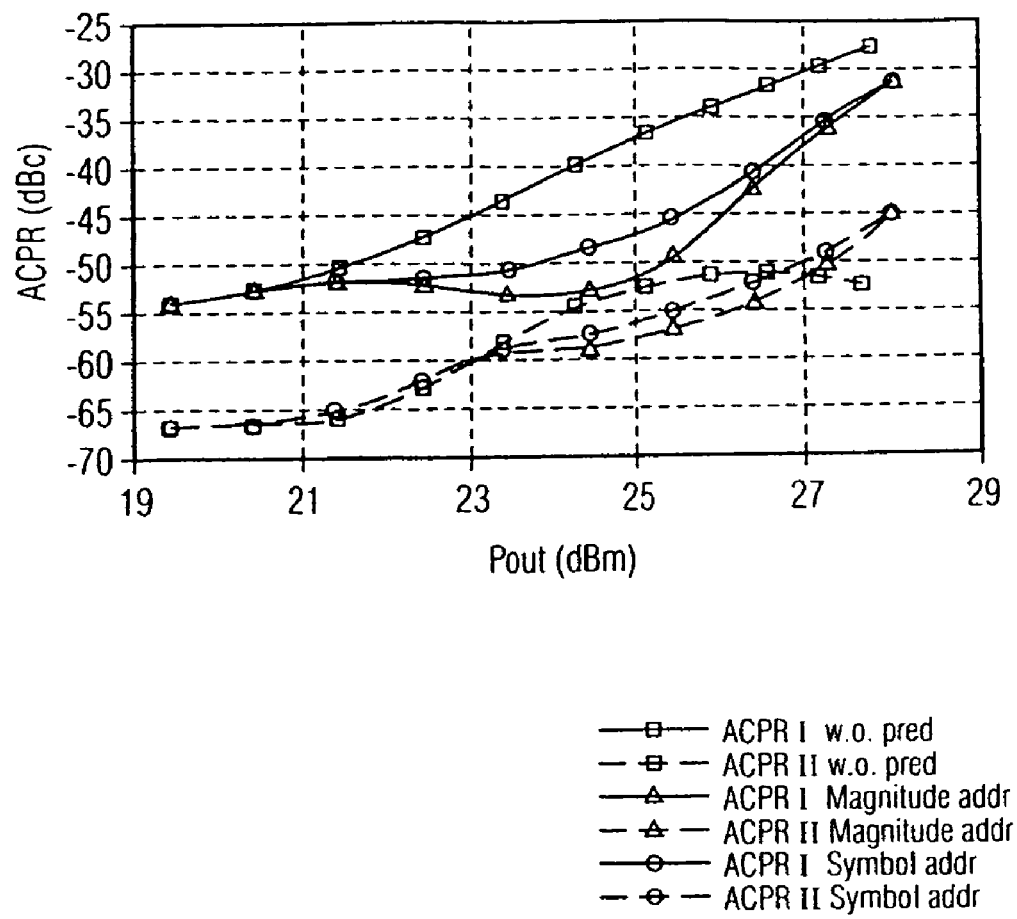
FIG. 7 shows an illustration of ACPR simulation results for a QPSK-modulated signal.

FIG. 6 shows ACPR (adjacent channel power ratio) measured values plotted against the output power Pout. In this case, a distinction has been drawn between cases without digital predistortion (the squares in FIG. 6), with digital predistortion and conventional amplitude addressing (the triangles in FIG. 6) and with digital predistortion and the addressing process according to the invention (the circles in FIG. 6). FIG. 7 shows ACPR simulation results in an analogous form.

A pseudo-random WCDMA signal with a peak-to-mean value ratio of 5.25 dB and with QPSK modulation and four constellation points was chosen as the signal. A power amplifier for CDMA/AMPS with an operating voltage of 3 V for 900 MHz was used as the amplifier.

FIGS. 6 and 7 show that the results obtained from the measurements and the simulations are close to one another. The improvements in the adjacent channel power ratios in the first and second adjacent channel (ACPR I and ACPR II) resulting from the digital predistortion with conventional amplitude addressing are about 12 and 3 dB, respectively. In comparison to this, the improvements in the adjacent channel power ratios in the first and second adjacent channel (ACPR I and ACPR II) resulting from digital predistortion with symbol addressing according to the invention are about 8 and 3 dB, respectively.

The ACPR II obtained from the measurements for output power Pout of less than 23 dBm is poorer than in the simulation. This is because of the noise in the spectrum analyser used.

The ACPR I characteristics with symbol addressing are at most 4 dB poorer than in the case of magnitude addressing. This is related to the quantization error which was allowed in this case in order to keep the memory requirement M small. The I and Q values at the output of the RRC pulse shaping filters 301 depend, in the present example, on 16 successive symbols, owing to the filter length. However, only the six symbols with the greatest influence on the magnitude were used for addressing in the present example.

A reduction in the roll-off factor of the RRC pulse shaping filters 301 increases the quantization error. It is expected that this would result in the ACPR becoming worse since the contribution of the filter coefficients to the secondary peaks thus becomes greater, and this is not included in the determination of the magnitude.

Figure 8:
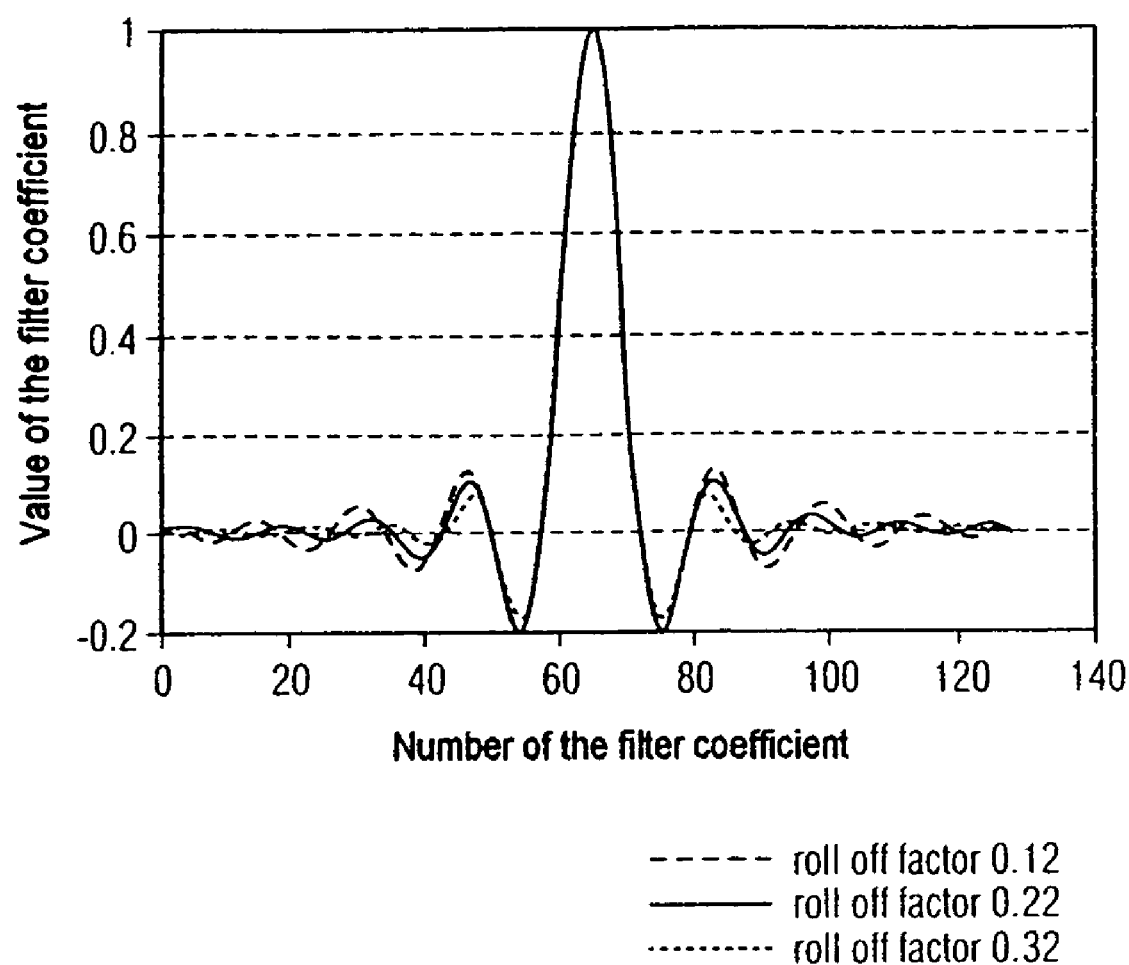
FIG. 8 shows an illustration of filter coefficients for an RRC pulse shaping filter.

FIG. 8 shows normalized RRC filters for three different roll-off factors. High roll-off factor values are advantageous for symbol addressing according to the invention since this reduces the quantization error.

An interpolation process is normally carried out between the sampled values in modern communication systems, so that the oversampling factor r can be reduced. This allows the memory size M to be reduced further. If this measure results in the oversampling factor r being halved to 4, the size M of the memory 304 is also halved on the basis of equation (1), and is accordingly now only 4 kwords (or 2 kwords on the basis of equation (2)).

An increase in the number x of the symbols from 6 to 8 increases the memory requirement M on the basis of equation (1) by a factor of 16 from 8 kwords (or 4 kwords on the basis of equation (2)) to 128 kwords (or 64 kwords on the basis of equation (2)).

The memory requirement M rises very quickly with the number n of values used in the constellation diagram. In a second example, QAM modulation with eight points in the constellation diagram is considered, in order to illustrate this relationship. Accordingly, on the basis of equation (1), for an oversampling factor r of 8, a symbol number x of 6 and 4 independent values of $n_I$ (a=2) for I in the constellation diagram and 2 values, which are dependent on $n_I$, of $n_Q$ (b=1) for Q resulting for a memory requirement M of 512 kwords. In this case, it should be remembered that Q can assume only two values for each value of I, so that, as already stated, eight points in the constellation diagram are considered.

The calculated value for the memory requirement M can be reduced, as in the first example, by interpolation processes and by a reduced oversampling factor r, to about 256 kwords.

The present example describes the relationships for a WCDMA signal in a mobile radio when using a data signal and a monitoring signal. As the CMOS technology progress continues, it will become ever more attractive to use solutions as described here.

We claim:

1. A device for processing data which is to be transmitted by radio, with the data to be transmitted being in the form of a digital baseband signal, the device comprising:
    a filter unit configured to receive the digital baseband signal at a chip rate and to perform a pulse shaping and oversampling of the digital baseband signal to produce a pulse shaped and oversampled digital baseband signal at a sampling rate that is greater than the chip rate;
    a predistortion unit configured to receive the pulse shaped and oversampled digital baseband signal of the filter unit and to perform a predistortion of the pulse shaped and oversampled digital baseband signal, wherein the predistortion unit comprises: a multiplication unit for multiplication of the pulse shaped and oversampled digital baseband signal by predistortion coefficients, and a first memory for storage of the predistortion coefficients; and
    a control unit configured to receive the digital baseband signal at the chip rate and to control the predistortion unit as a function of the digital baseband signal, the control unit comprising: a second memory in which amplitude values have been stored in advance of processing the data which is to be transmitted by radio; and addressing logic configured to select amplitude values from the second memory as a function of the digital baseband signal such that the selected amplitude values correspond to amplitude values of the pulse shaped and oversampled digital baseband signal generated by the filter unit, the addressing logic being clocked at the chip rate, wherein the predistortion coefficients are selected from the first memory based on amplitude values selected from the second memory.

2. The device according to claim 1, wherein the digital baseband signal and the baseband signals which are produced from it are complex signals.

3. The device according to claim 1, further comprising:
    a digital/analogue converter unit configured to convert the predistorted baseband signal.

4. The device according to claim 3, further comprising:
    a further filter unit configured to low-pass filter the analogue baseband signal.

5. The device according to claim 1, further comprising:
    a modulator unit with an oscillator configured to modulate a radio-frequency carrier, with the baseband signal, in particular via an intermediate frequency.

6. The device according to claim 5, further comprising:
    an amplifier unit configured to amplify the modulated radio-frequency signal with a variable gain, the gain being controllable in analogue form or being digitally programmable.

7. The device according to claim 5, further comprising:
    a power amplifier configured to amplify the modulated radio-frequency signal.

8. A transmitting device configured to send data by radio, with the data to be transmitted being in the form of a digital baseband signal, the transmitting device comprising:
    the device according to claim 1.

9. The device according to claim 1, further comprising:
    a power control unit configured to supply a multiplier value corresponding to a desired power level, wherein the first memory supplies to the multiplication unit predistortion coefficients selected by addresses generated by multiplying the amplitude values selected from the second memory by the multiplier value.

10. A method for processing of data to be transmitted by radio, with the data to be transmitted being in the form of a digital baseband signal, the method comprising:

pulse shaping and oversampling the digital baseband signal via a filter unit configured to receive the digital baseband signal at a chip rate to produce a pulse shaped and oversampled digital baseband signal at a sampling rate that is greater than the chip rate;

storing predistortion coefficients in advance in a first memory;

selecting, at the chip rate, amplitude values from a second memory as a function of the digital baseband signal, wherein the amplitude values have been stored in the second memory in advance of processing of the data to be transmitted by radio and correspond to amplitude values of the pulse shaped and oversampled digital baseband signal generated by the filter unit;

selecting the predistortion coefficients from the first memory for predistortion as a function of the amplitude values selected from the second memory; and multiplying the pulse shaped and oversampled digital baseband signal by the selected predistortion coefficients to predistort the pulse shaped and oversampled digital baseband signal via a predistortion unit configured to receive the pulse shaped and oversampled digital baseband signal.

11. The method according to claim 10, wherein the digital baseband signal and the baseband signals which are produced from it are complex signals.

12. The method according to claim 10, wherein the predistorted digital baseband signal is converted to an analogue baseband signal.

13. The method according to claim 10, wherein a radio-frequency carrier is modulated with the baseband signal via an intermediate frequency.

14. The method according to claim 13, wherein the modulated radio-frequency signal is amplified with a variable gain, the gain being controllable in analogue form or being digitally programmable.

15. The method according to claim 13, wherein the modulated radio-frequency signal is amplified by a power amplifier.

16. A method for transmission of data by radio, with the data to be transmitted being in the form of a digital baseband signal, using the method for processing the digital baseband signal according to claim 10.

17. The method according to claim 10, wherein addressing of the first memory is controlled by addresses generated by multiplying the amplitude values selected from the second memory by a multiplier value corresponding to a desired power level.

* * * * *